United States Patent
Rashed et al.

(10) Patent No.: US 9,196,548 B2
(45) Date of Patent: Nov. 24, 2015

(54) METHODS OF USING A TRENCH SALICIDE ROUTING LAYER

(71) Applicants: Mahbub Rashed, Cupertino, CA (US); Srikanth Samavedam, Fishkill, NY (US); David Doman, Austin, TX (US); Navneet Jain, Milpitas, CA (US); Subramani Kengeri, San Jose, CA (US); Suresh Venkatesan, Saratoga Springs, NY (US)

(72) Inventors: Mahbub Rashed, Cupertino, CA (US); Srikanth Samavedam, Fishkill, NY (US); David Doman, Austin, TX (US); Navneet Jain, Milpitas, CA (US); Subramani Kengeri, San Jose, CA (US); Suresh Venkatesan, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 143 days.

(21) Appl. No.: 13/729,843

(22) Filed: Dec. 28, 2012

(65) Prior Publication Data

US 2014/0183638 A1 Jul. 3, 2014

(51) Int. Cl.
*H01L 21/84* (2006.01)
*H01L 27/12* (2006.01)
*H01L 21/8238* (2006.01)
*H01L 27/092* (2006.01)

(52) U.S. Cl.
CPC ...... *H01L 21/845* (2013.01); *H01L 21/823821* (2013.01); *H01L 27/0924* (2013.01); *H01L 27/1211* (2013.01)

(58) Field of Classification Search
CPC ................. H01L 21/845; H01L 27/1211
USPC ............................................. 257/350
See application file for complete search history.

(56) References Cited

U.S. PATENT DOCUMENTS

| | | | |
|---|---|---|---|
| 2003/0077891 A1* | 4/2003 | Drynan | 438/618 |
| 2007/0085151 A1* | 4/2007 | Kotani | 257/393 |
| 2011/0222332 A1 | 9/2011 | Liaw et al. | |
| 2011/0317485 A1* | 12/2011 | Liaw | 365/182 |
| 2012/0001197 A1* | 1/2012 | Liaw et al. | 257/77 |
| 2012/0107729 A1* | 5/2012 | Blatchford et al. | 430/5 |
| 2012/0223395 A1* | 9/2012 | Liaw | 257/390 |
| 2013/0235652 A1* | 9/2013 | Liaw | 365/156 |

OTHER PUBLICATIONS

Taiwanese Office Action for related Taiwanese Patent Application No. 102122117 dated Apr. 14, 2015, 17 pages.

* cited by examiner

*Primary Examiner* — Andy Huynh
*Assistant Examiner* — Sitaramarao S Yechuri
(74) *Attorney, Agent, or Firm* — Ditthavong & Steiner, P.C.

(57) ABSTRACT

Methodology enabling selectively connecting fin structures using a segmented trench salicide layer, and the resulting device are disclosed. Embodiments include: providing on a substrate at least one gate structure; providing first and second fin structures in a vertical direction intersecting with the at least one gate structure; and providing a first segment of a salicide layer, the first segment being formed along a horizontal direction and being connected with the second fin structure and separated from the first fin structure.

18 Claims, 6 Drawing Sheets

METHODS OF USING A TRENCH SALICIDE ROUTING LAYER

TECHNICAL FIELD

The present disclosure relates to manufacture of semiconductor devices utilizing a trench salicide layer to route connections to transistors. The present disclosure is particularly applicable in designs utilizing single sided contacted polysilicon pitch for the 20 nanometer (nm) technology node and beyond.

BACKGROUND

In fabrication of semiconductor devices, standard cells are the building blocks of design logic. However, reducing a resulting size of standard cells requires a logic scaling of features, which is restricted, particularly for 20 nm technology nodes and beyond. This in turn results in loss of power, performance, and leakage. However, traditional methods use differing active region sizes to optimize transistor sizing that prevents effective logical scaling of features for standard cells. In advanced nodes such as 20 nm and 14 nm with finfet transistors, the device sizes are quantized, and circuit power, performance, and leakage need to be optimized by selecting the number of fins which are appropriate for a given circuit. However, removing dummy fins from active fins might risk patterning and etching, which can lead to more fin variations.

A need therefore exists for methodology enabling a optimization of the number of fins for a circuit, and the resulting device.

SUMMARY

An aspect of the present disclosure is a method of selectively connecting features using a trench salicide layer, inter alia, utilizing segments of a salicide layer being connected with a first fin structure and separated from a second fin structure.

Another aspect of the present disclosure is a device having, inter alia, a segment of a salicide layer being connected with a first fin structure and separated from a second fin structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing on a substrate at least one gate structure; providing first and second fin structures in a vertical direction intersecting with the at least one gate structure; and providing a first segment of a salicide layer, the first segment being formed along a horizontal direction and being connected with the second fin structure and separated from the first fin structure.

Aspects include providing a second segment of the salicide layer formed along the horizontal direction and vertically separated from the first segment by the at least one gate structure, the second segment connecting with the first fin structure and separated from the second fin structure. Further aspects include: providing third, fourth, fifth, and sixth fin structures intersecting with the at least one gate structure, the second fin structure separating the first and third fin structures, the fourth fin structure separating the first and fifth fin structures, and the fifth fin structure separating the fourth and sixth fin structures; providing first, second, and third sets of segments of the salicide layer formed along the horizontal direction, each of the first, second, and third sets having different vertical positions, separated from each other by a gate structure of the at least one gate structure, wherein the second set separates the first and third sets, and the first set includes the first segment; providing the first set having the first segment connected with the second and third fin structures, a segment connected with the fourth fin structure and a segment connected with the fifth and sixth fin structures; providing the second set having a segment connected with the first fin structure, a segment connected with the second and third fin structures, a segment connected with the fourth fin structure, and a segment connected with the fifth and sixth fin structures; and providing the third set having a segment connected with the first fin structure, a segment connected with the second and third fin structures, and a segment connected with the fifth and sixth fin structures. Some aspects include providing, on the substrate, a static random access memory (SRAM) bitcell having first and second pull-down (PD), pass-gate (PG), and pull-up (PU) transistors, the first set of segments being formed on the first PD, PG, and PU transistors and the third set of segments being formed on the second PD, PG, and PU transistors, wherein the first segment is on the first PG transistor. Additional aspects include: providing third, fourth, fifth, and sixth fin structures intersecting with the at least one gate structure, the third fin structure separating the second and fourth fin structures, and the fifth fin structure separating the fourth and sixth fin structures; providing first, second, and third sets of segments of the salicide layer formed along the horizontal direction, each of the first, second, and third sets having different vertical positions, separated from each other by a gate structure of the at least one gate structure, wherein the second set separates the first and third sets, and the first set includes the first segment; providing the first set having the first segment connected with the second fin structure, a segment connected with the fourth fin structure and a segment connected with the fifth and sixth fin structures; providing the second set having a segment connected with the first and second fin structures, a segment connected with the third fin structure, a segment connected with the fourth fin structure, and a segment connected with the fifth and sixth fin structures; and providing the third set having a segment connected with the first and second fin structures, a segment connected with the third fin structure, and a segment connected with the fifth fin structure. Further aspects include providing, on the substrate, a SRAM bitcell having first and second PD, PG, and PU transistors, the first set of segments being formed on the first PD, PG, and PU transistors and the third set of segments being formed on the second PD, PG, and PU transistors, wherein the first segment is on the first PG transistor. Some aspects include: providing, on the substrate, a read-only memory (ROM) bitcell, the second fin structure and the first segment being formed on the ROM bitcell; and providing a second segment of the trench salicide layer formed along the horizontal direction indicating a state of the ROM bitcell by being connected or separated from the second fin structure, the first and second segments having different vertical positions on the substrate and separated from each other by a gate structure of the at least one gate structure. Additional aspects include a method, wherein the salicide layer is a trench salicide layer, the method further including: providing the first and second fin structures with equal and unbroken spans in the vertical direction; and providing a third fin structure on the substrate separated from the salicide layer. Further aspects include a method, wherein the second fin structure is included in a netlist based on being connected with the salicide layer and the first fin structure is excluded from the netlist based on being separated from the salicide layer.

Another aspect of the present disclosure is a device having: at least one gate structure on a substrate; first and second fin structures in a vertical direction intersecting with the at least one gate structure; and a first segment of a salicide layer, the first segment being formed along a horizontal direction being connected with the second fin structure and separated from the first fin structure.

Aspects include a device having a second segment of the salicide layer formed along the horizontal direction and vertically separated from the first segment by the at least one gate structure, the second segment connecting with the first fin structure and separated from the second fin structure. Some aspects include a device having: third, fourth, fifth, and sixth fin structures intersecting with the at least one gate structure, the second fin structure separating the first and third fin structures, the fourth fin structure separating the first and fifth fin structures, and the fifth fin structure separating the fourth and sixth fin structures; a first set of segments having the first segment connected with the second and third fin structures, a segment connected with the fourth fin structure and a segment connected with the fifth and sixth fin structures; a second set of segments having a segment connected with the first fin structure, a segment connected with the second and third fin structures, a segment connected with the fourth fin structure, and a segment connected with the fifth and sixth fin structures; and a third set of segments having a segment connected with the first fin structure, a segment connected with the second and third fin structures, and a segment connected with the fifth and sixth fin structures, wherein the first, second, and third sets of segments are formed along the horizontal direction, each of the first, second, and third sets having different vertical positions, separated from each other by a gate structure of the at least one gate structure, and the second set separates the first and third sets. Further aspects include a device having: third, fourth, fifth, and sixth fin structures intersecting with the at least one gate structure, the third fin structure separating the second and fourth fin structures, and the fifth fin structure separating the fourth and sixth fin structures; a first set of segments having the first segment connected with the second fin structure, a segment connected with the fourth fin structure and a segment connected with the fifth and sixth fin structures; a second set of segments having a segment connected with the first and second fin structures, a segment connected with the third fin structure, a segment connected with the fourth fin structure, and a segment connected with the fifth and sixth fin structures; and a third set of segments having a segment connected with the first and second fin structures, a segment connected with the third fin structure, and a segment connected with the fifth fin structure, wherein the first, second, and third sets of segments are formed along the horizontal direction, each of the first, second, and third sets having different vertical positions, separated from each other by a gate structure of the at least one gate structure, and the second set separates the first and third sets. Additional aspects include a device having a SRAM bitcell having first and second PD, PG, and PU transistors, the first set of segments being formed on the first PD, PG, and PU transistors and the third set of segments being formed on the second PD, PG, and PU transistors, wherein the first segment is on the first PG transistor. Some aspects include a device having: a ROM bitcell the second fin structure and the first segment being formed on the ROM bitcell; and a second segment of the trench salicide layer formed along the horizontal direction indicating a state of the ROM bitcell by being connected or separated from the second fin structure, the first and second segments having different vertical positions on the substrate and separated from each other by a gate structure of the at least one gate structure. Further aspects include a device, wherein: the salicide layer is a trench salicide layer; and the first and second fin structures have equal and unbroken spans in the vertical direction, and wherein the apparatus further includes a third fin structure on the substrate separated from the salicide layer.

Another aspect of the present disclosure is a method including: providing on a substrate a plurality of gate structures; providing first, second, third, fourth, fifth, and sixth fin structures in a vertical direction intersecting with the gate structures, each having equal and unbroken spans in the vertical direction, the second fin structure separating the first and third fin structures, the fourth fin structure separating the third and fifth fin structures, the fifth fin structure separating the fourth and sixth fin structures; providing a first SRAM bitcell on the substrate having first and second PD, PG, and PU transistors and a second SRAM bitcell on the substrate having third and fourth PD, PG, and PU transistors; providing a first set of segments of the trench salicide layer formed along a horizontal direction, the first set having a segment on the first PD transistor connected with the first and second fin structures, a segment on the first PU transistor connected with the third fin structure, a segment on the first PG transistor connected with the fifth and sixth fin structures; providing a second set of segments of the trench salicide layer formed along the horizontal direction, the second set having a segment connected with the first and second fin structures, a segment connected with the third fin structure, a segment connected with the fourth fin structure, and a segment connected with the fifth and sixth fin structures; providing a third set of segments of the trench salicide layer formed along the horizontal direction, the third set having a segment on the second PG transistor connected with the first and second fin structures, a segment on the second PU transistor connected with the fourth fin structure, a segment on the second PD transistor connected with the fifth and sixth fin structures; providing a fourth set of segments of the trench salicide layer formed along the horizontal direction, the fourth set having a segment on the third PD transistor connected with the first and second fin structures, a segment on the third PU transistor connected with the third fin structure, a segment on the first PG transistor connected with the fifth fin structure; providing a fifth set of segments of the trench salicide layer formed along the horizontal direction, the fifth set having a segment connected with the first and second fin structures, a segment connected with the third fin structure, a segment connected with the fourth fin structure, and a segment connected with the fifth and sixth fin structures; and providing a sixth set of segments of the trench salicide layer formed along the horizontal direction, the sixth set having a segment on the fourth PG transistor connected with the second fin structure, a segment on the fourth PU transistor connected with the fourth fin structure, a segment on the fourth PD transistor connected with the fifth and sixth fin structures, wherein the second set separates the first and third sets, the third set separates the second and fourth sets, the fourth set separates the third and fifth sets, and the fifth set separates the fourth and sixth sets, and the first, second, third, fourth, fifth and sixth sets have different vertical positions on the substrate and are each separated from each other by a gate structure of the gate structures.

Some aspects include providing a seventh fin structure in the vertical direction intersecting with the gate structures on the substrate separated from the trench salicide layer. Additional aspects include a method, wherein the seventh fin structure is excluded from a netlist based on being separated from the trench salicide layer. Some aspects include: providing, on the substrate, a ROM bitcell, the first fin structure being formed on the ROM bitcell; providing, on the ROM bitcell, a first segment of the trench salicide layer formed along the horizontal direction and connected with the first fin structure; and providing a second segment of the trench salicide layer formed along the horizontal direction indicating a state of the ROM bitcell by being connected or separated from the first fin structure, the first and second segments having different vertical positions on the substrate and being separated from each other by a gate structure of the gate structures.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of loss of power, performance, and leakage as well as functionality of logic library cells attendant upon scaling standard cells, particularly standard cells having SRAM bitcells for 20 nm technology nodes and beyond. In accordance with embodiments of the present disclosure, the problems are solved, for instance by, inter alia, utilizing segments of a salicide layer being connected with a first fin structure and separated from a second fin structure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
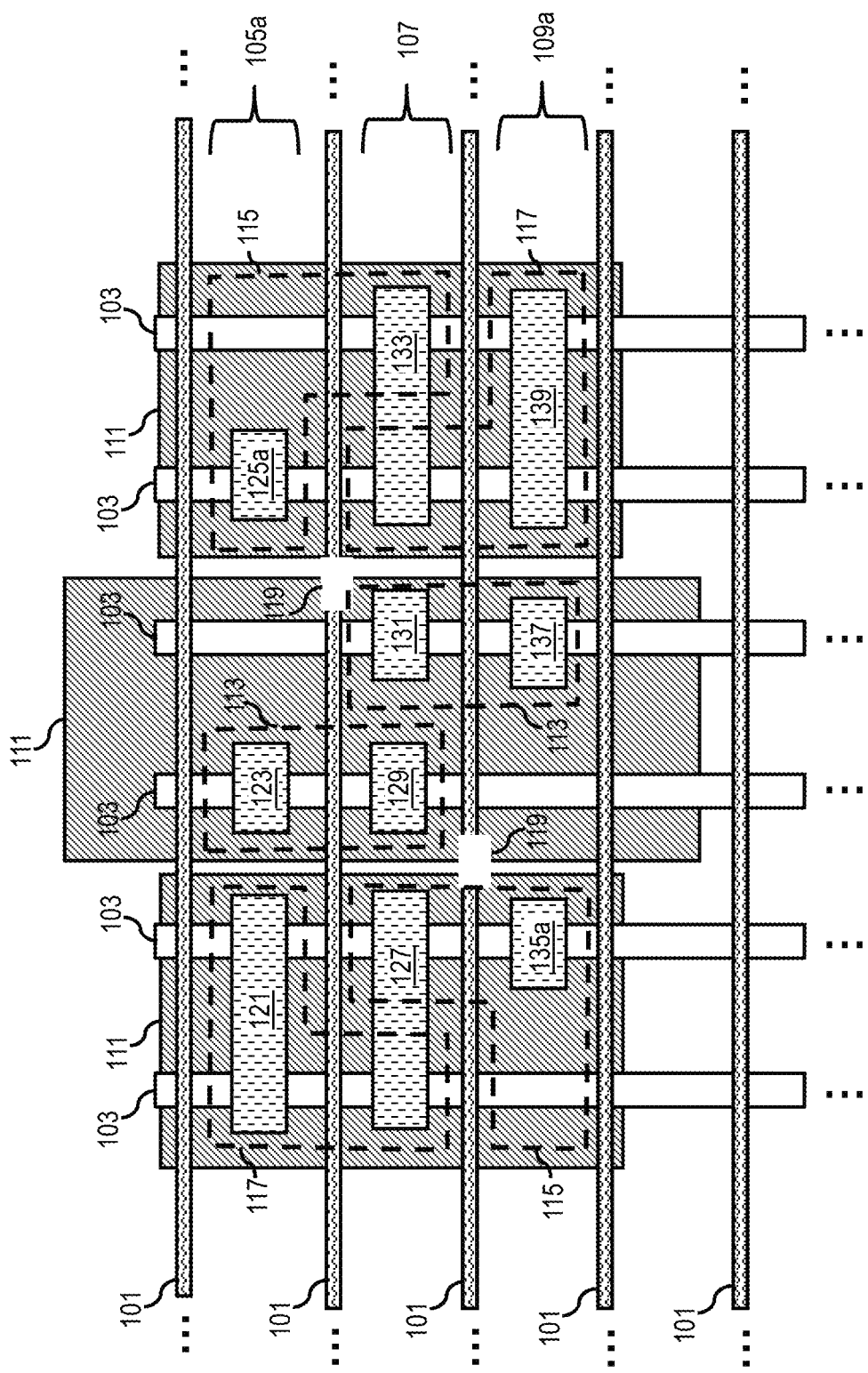
FIGS. 1A and 1B schematically illustrate SRAM bitcells utilizing segments of a salicide layer, in accordance with exemplary embodiments.
Figure 1B:
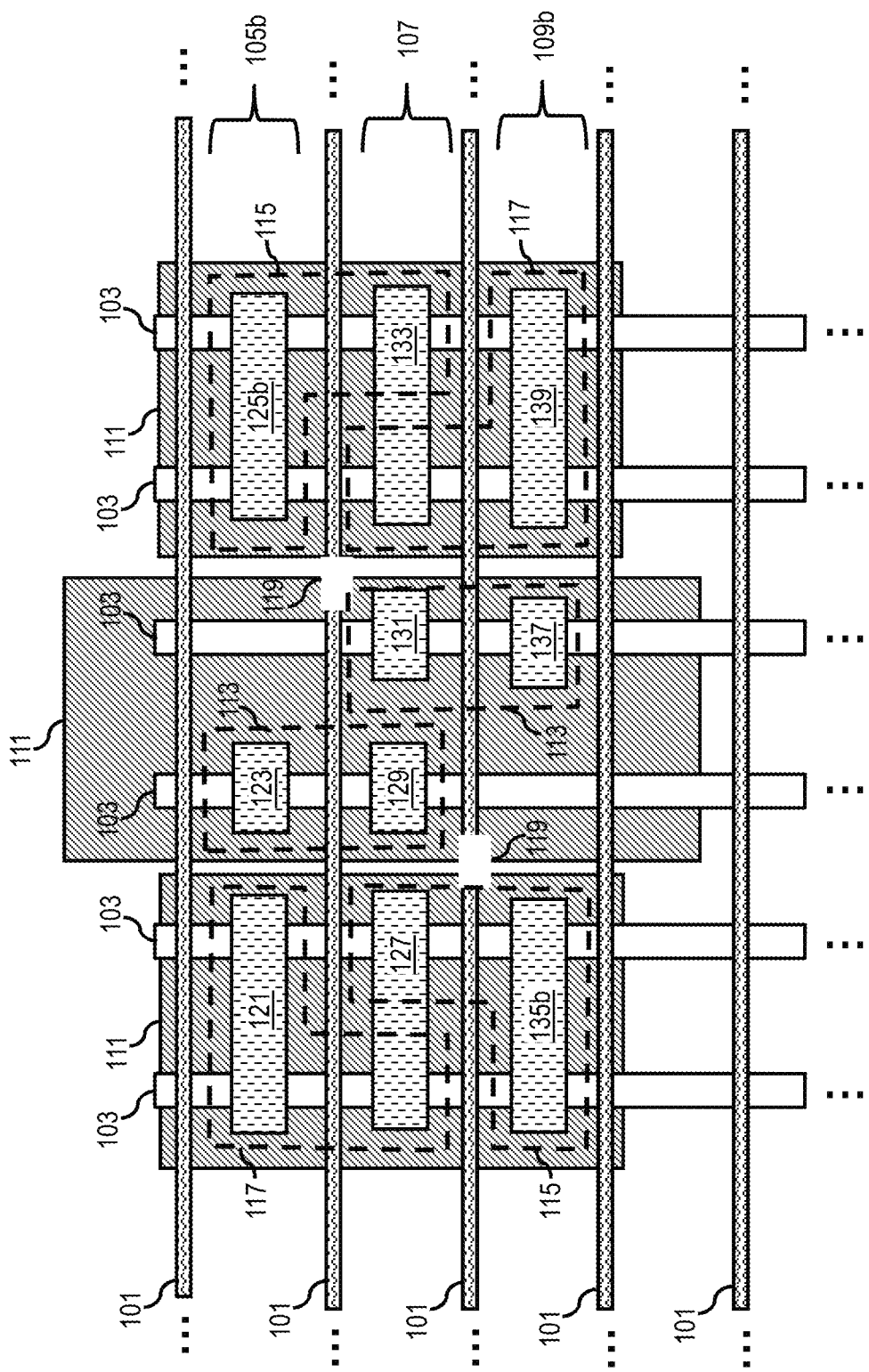

FIGS. 1A and 1B schematically illustrate SRAM bitcells utilizing segments of a salicide layer, in accordance with exemplary embodiments. FIG. 1A illustrates a 1-1-2 SRAM and FIG. 1B illustrates a 1-2-2 SRAM. FIGS. 1A and 1B include gate structures 101, fin structures 103, first, second, and third sets of segments 105a and 105b, 107, and 109a and 109b, respectively, active (RX) regions 111, PU transistors 113, PG transistors 115, and PD transistors 117. As shown in FIGS. 1A and 1B, gate structures 101 include cuts 119, and fin structures 103 have equal and unbroken spans in a vertical direction intersecting with gate structures 101. Further, sets of segments 105, 107, and 109 are formed along a horizontal direction having different vertical positions in a trench salicide layer and are separated from each other by gate structures 101.

Adverting to FIG. 1A, the first set 105a includes segment 121 on a first PD transistor 117 connected with first and second fin structures 103, a segment 123 on a first PU transistor 113 connected with a third fin structure 103, a segment 125a on a first PG transistor 115 connected with a fifth fin structures 103. The second set 107 includes a segment 127 on the first PD transistor 117 and on a second PG transistor 115 connected with the first and second fin structures 103, a segment 129 on the first PU transistor 113 connected with the third fin structure 103, a segment 131 on the second PU transistor 113 connected with a fourth fin structure 103, and a segment 133 on the first PG transistor 115 and on a second PD transistor 117 connected with fifth and sixth fin structures 103. Finally, the third set 109a includes a segment 135a on the second PG transistor 115 connected with a second fin structure 103, a segment 137 on the second PU transistor 113 connected with the fourth fin structure 103, and a segment 139 on the second PD transistor 117 connected with the fifth and sixth fin structures 103. The trench salicide layer (e.g., segments 121-139) may connect to upper layers such as contacts (CA) or vias (V0).

Adverting to FIG. 1B, the 1-2-2 SRAM is substantially similar except the first and third sets 105b and 109b differ from 105a and 109a, respectively. Specifically, the first set 105b includes segments 121 and 123 as shown in FIG. 1A, and a segment 125b on a first PG transistor 115 connected with the fifth and sixth fin structures 103. Additionally, the third set 109b includes segment 135b on the second PG transistor 115 connected with the first and second fin structures 103, and segments segment 137 and 139 as shown in FIG. 1A.

The exemplary 1-2-2 and 1-1-2 SRAM embodiments may be combined in a single design. For example, the 1-2-2 and 1-1-2 SRAM may share common fin structures (e.g., 103) and different sets of segments, may share sets of segments (e.g., 105a, 107, and 109a) and have different fin structures, or may share a substrate but have different sets of segments and fin structures. As such, the trench salicide layer (e.g., segments 121-139) may be used to connect a drain of an n-type field-effect transistor (e.g., PG and PD transistors 115 and 117) to a drain of a p-type field-effect transistor (e.g. PU transistor 113) without crossing a polysilicon boundary (e.g., gate structures 101) and only allowed when a single sided polysilicon contact is present. As a result, a risk of very narrow trench salicide or of a dielectric breakdown between trench salicide and contact is reduced. Further, the trench salicide layer may be utilized to select a type of SRAM (e.g., 1-1-2 or 1-2-2) to optimize performance (e.g., power, leakage, functionality) of a resulting design. For example, segments of a salicide layer may be utilized to selectively connect with fin structures, to form 1-1-2 type SRAM to improve cell stability (e.g., beta and gamma ratios) and minimum voltage, and to form a 1-2-2 type SRAM to improve a performance (e.g., speed) of a resulting device. As such, designs may be optimized to balance a use of 1-1-2 type SRAM to improve a read speed and a use of 1-2-2 type SRAM to improve a write margin of a resulting device. It is noted that the use of a salicide layer to selectively connect with fin structures maintains a fin structure printability and requires less processing time (e.g., for silicon out with mask respin) than removing fin structures and may additionally be used when single transistor fin cut is not possible due to a narrow distance. Additionally, the processes described above may be formed using a single or double (e.g., LELE) mask process.

Additionally, the use of a trench salicide layer to selectively connect fin structures enables leakage reduction of a resulting design by reducing a number of feedback transistor fins. For example, an inactive fin structure of the fin structures 101 is not connected using the salicide layer (e.g., sets 105, 107, and 109). As such, a set-up time improvement by 1-2 picoseconds (ps) and a clock-to-Q improvement of 3-4 ps have been observed. Further observed results of leakage reduction are illustrated in table 1.

TABLE 1

| Cell Leakage (mW)/PVT | Flop-Original Fins | Flop-Reduced Fins | % leakage Power Reduction |
|---|---|---|---|
| max.SS.081v.125c | 3.59e−05 | 3.13e−05 | 12.89 |
| max.SS.081v.m40c | 7.68e−08 | 6.69e−08 | 12.95 |
| min.FF.099v.125c | 5.49e−05 | 4.78e−05 | 12.94 |
| min.FF.099v.m40c | 2.31e−07 | 1.96e−07 | 14.98 |
| nom.TT.090v.25c | 1.50e−06 | 1.29e−06 | 14.42 |

In yet another example, the trench salicide layer allows partial strapping of PU transistors and a selection of a size of PU transistors enabling an optimization of pull-up current, since pull-up transistors are either in a linear region or an off state. That is, extension resistance may be optimized in a resulting design utilizing the trench salicide layer.

Figure 2A:
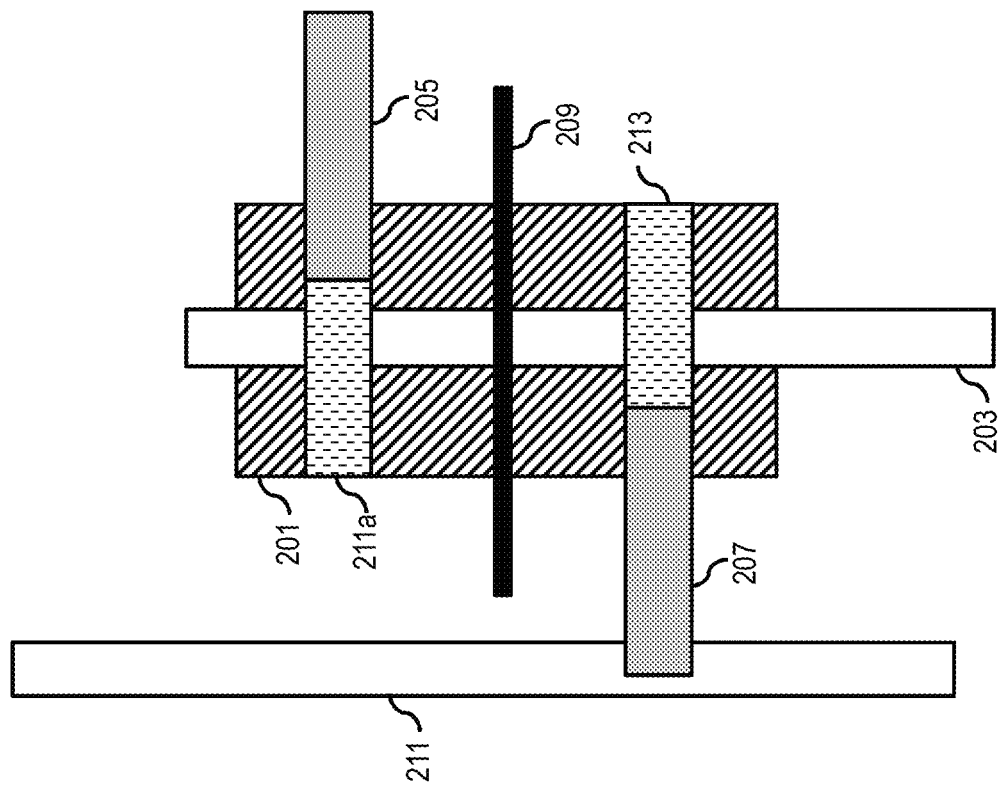
FIGS. 2A and 2B schematically illustrate ROM bitcells utilizing segments of a salicide layer, in accordance with exemplary embodiments.
Figure 2B:
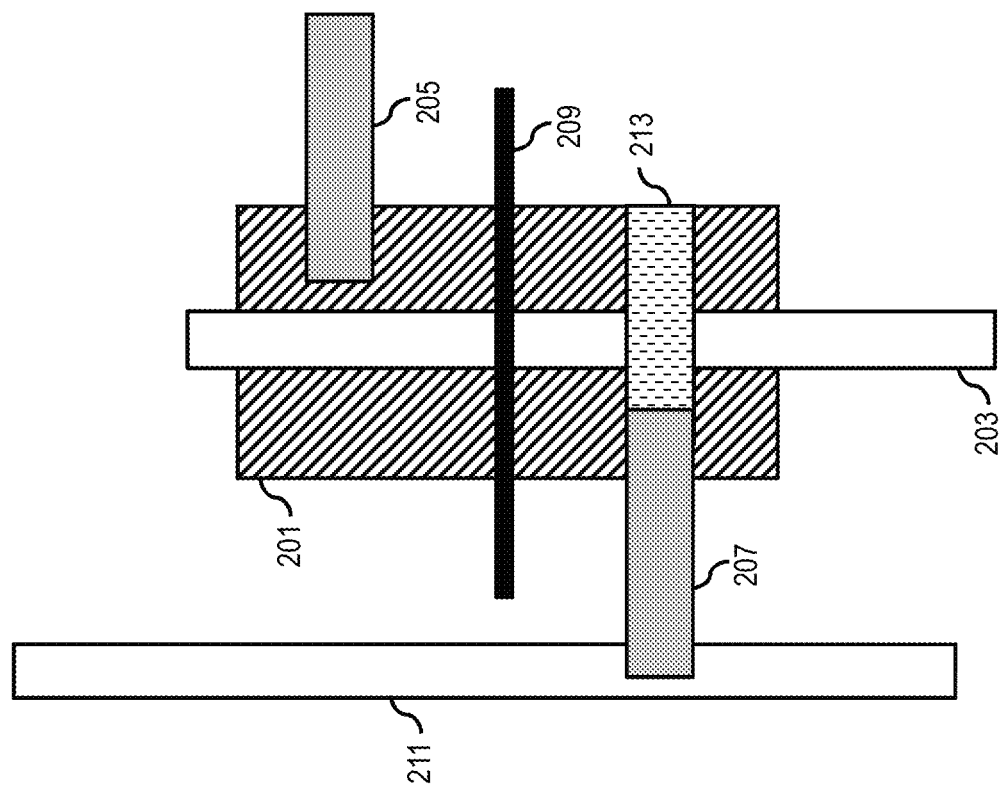

FIGS. 2A and 2B schematically illustrate ROM bitcells utilizing segments of a salicide layer, in accordance with exemplary embodiments. FIG. 2A illustrates ROM indicating a first state (e.g., '1') and FIG. 2B illustrates ROM bitcell indicating a second state (e.g., '0'). FIGS. 2A and 2B illustrate ROM bitcells that include an RX region 201 having a fin structure 203 and contacts 205 and 207 separated by a gate structure 209. As shown, the contact 207 connects gate contact (CB) 211 to fin structure 203 via a trench salicide segment 213. Adverting to FIG. 2A, ROM bitcell indicates a first state by connecting contact 205 to fin structure 203 via a trench salicide segment 211a. Alternatively, ROM bitcell may indicate a second state by separating contact 205 from fin structure 203 and omitting trench salicide segment 211a as shown in FIG. 2B. Additionally, using the trench salicide layer to select a state of the ROM bitcell enables the state to be changed at a later stage in processing, since the formation of segments 211a and 213 may be in the middle of a processing step, unlike the formation of a RX region 201. Similarly, the trench salicide layer may be utilized to selectively connect (or disconnect) buffers by selectively connecting (or disconnecting) fin structures of a design, enabling circuit timing fixes such as, for example, set-up/hold, to be changed at a later stage in a processing. That is, the trench salicide layer may be utilized to fix set-up and hold margin in a digital circuit by balancing clock tree and data paths.

Figure 3:
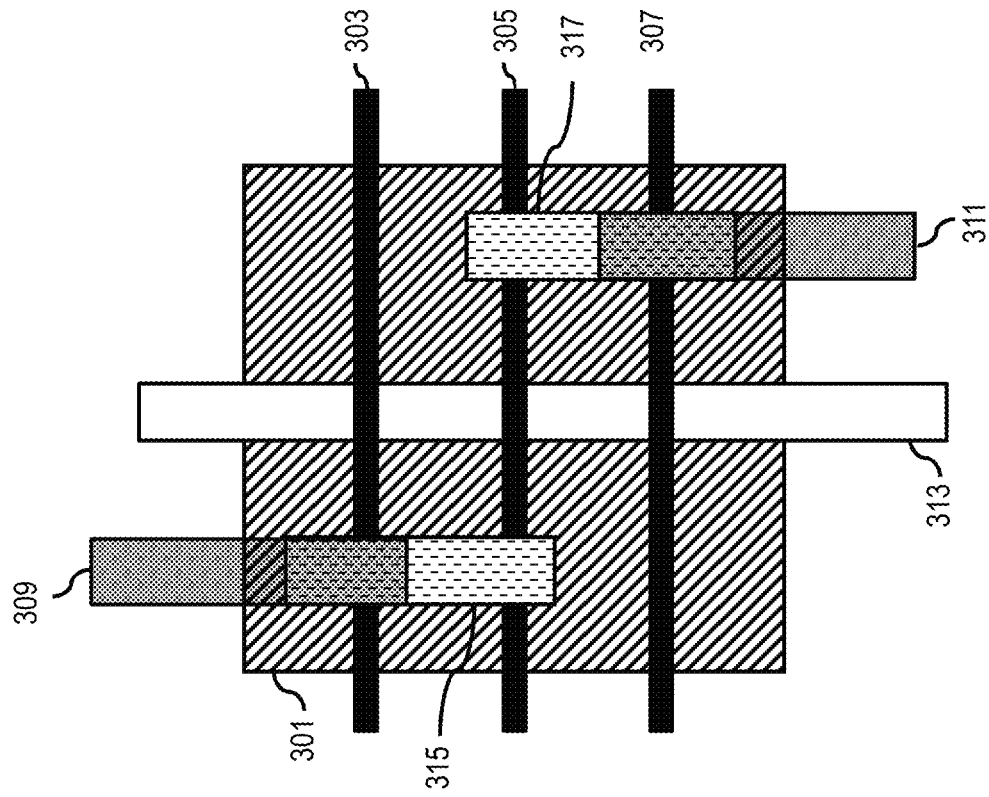
FIG. 3 schematically illustrates a merging of two active fins utilizing segments of a salicide layer, in accordance with an exemplary embodiment.

FIG. 3 schematically illustrates a merging of two active fins utilizing segments of a salicide layer, in accordance with an exemplary embodiment. As illustrated, FIG. 3 includes an RX region 301 having fin structures 303, 305, and 307, and contacts 309 and 311 separated by gate structure 313. Contacts 309 and 311 are connected to salicide segments 315 and 317, respectively. Salicide segment 315 in turn connects to and merges fin structures 303 and 305, and silicide segment 317 connects to and merges fin structures 305 and 307. Thus, transistor sizing may be enabled by utilizing the trench salicide layer to merge fin structures, thereby controlling the number of fins connected to the active circuit.

Figure 4:
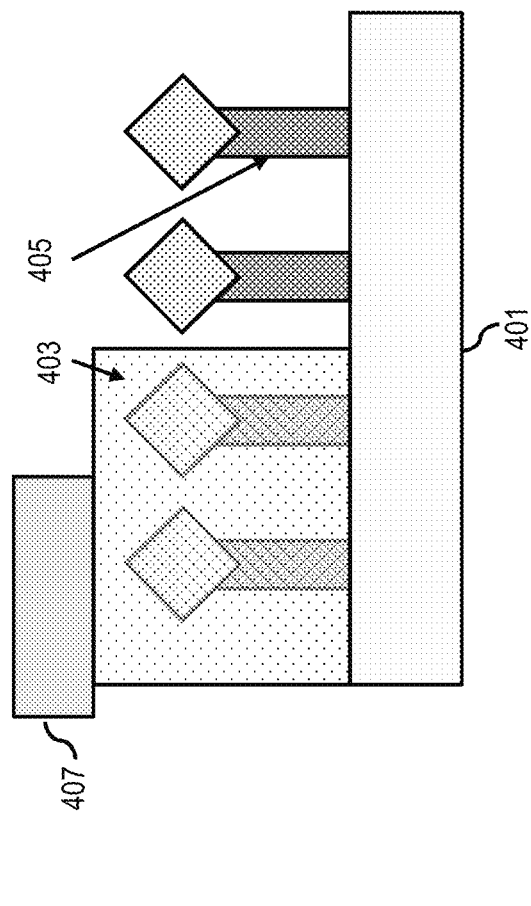
FIG. 4 schematically illustrates a reduction of transistors in a netlist enabled by utilizing segments of a salicide layer, in accordance with an exemplary embodiment.

FIG. 4 schematically illustrates a reduction of transistors in a netlist enabled by utilizing segments of a salicide layer, in accordance with an exemplary embodiment. Adverting to FIG. 4, a cross-section view in a source/drain (S/D) area for a transistor 400 includes an active region 401, a trench salicide 403, fin structures 405, and CA 407. As illustrated in FIG. 4, the transistor 400, using salicide layer 403 to selectively connect to fin structures 405, enables a reduction of active fin structures, for example, from four active fin structures to two active fin structures. Furthermore, such a reduction enables a reduction in computation effort in modeling electronic characteristics by removing inactive fin structures, for instance, fin structures 405 separated from trench salicide 403, from a netlist.

Using a trench salicide routing layer (e.g., layer 403) enables a reduction in scan-D-flip-flop area by a polysilicon pitch without an increase in cost of a resulting device or an increase in effort for designing a mask for generating the resulting device. For example, a 5% reduction in scan-D-flip-flop area has been achieved, resulting in an overall logic scaling reduction of 2-3% without any increases in mask cost. Additionally, the processes and devices described in FIGS. 1 through 4 allow use of a single sided contacted polysilicon pitch which performs better for denser polysilicon pitches (e.g., 90 nm technology nodes and beyond). As such, both a 640 nm high density library (e.g., 8 tracks of 80 nm) and a 576 nm high density library (e.g., 9 tracks of 64 nm) benefit from the processes described in FIGS. 1 through 4. It is noted that the processes described herein may utilize a fully double contact polysilicon based trench salicide for designs in technology nodes of 90 nm and larger. However, use of a fully double contact polysilicon based trench salicide for designs in technology nodes beyond 90 nm (e.g., 20 nm) causes a considerable risk of causing a short between trench salicide and a contact or dielectric breakdown, rendering the resulting device inoperable.

The embodiments of the present disclosure can achieve several technical effects, including formation of a trench salicide layer selectively connecting fin structures, thereby providing more efficient use of bitcell layout area. The present disclosure enjoys industrial applicability in any of various types of highly integrated semiconductor devices, particularly SRAM bitcells for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing on a substrate at least one gate structure;
providing first and second fin structures in a vertical direction intersecting with the at least one gate structure;
providing first, second, and third sets of segments of a salicide layer, each of the first, second, and third sets having different vertical positions, separated from each other by a gate structure of the at least one gate structure, wherein the second set separates the first and third sets, and each of the sets of segments comprises segments having a length extending along a horizontal direction perpendicular to the vertical direction;
providing a first segment in the first set of segments of the salicide layer, the first segment being connected with the second fin structure and separated from the first fin structure; and
providing a second segment in the second set of segments of the salicide layer, the second segment selectively connecting with the first fin structure and separating from the second fin structure,
wherein positions of the segments of the salicide layer determine selection between a 1-1-2 type of static random access memory (SRAM) configuration and a 1-2-2 type of SRAM configuration.

2. The method according to claim 1, comprising:
providing third, fourth, fifth, and sixth fin structures intersecting with the at least one gate structure, the second fin structure separating the first and third fin structures, the fourth fin structure separating the third and fifth fin structures, and the fifth fin structure separating the fourth and sixth fin structures;
providing the first set having the first segment connected with the second and third fin structures, a segment connected with the fourth fin structure and a segment connected with the fifth and sixth fin structures;
providing the second set having a segment connected with the first fin structure, a segment connected with the second and third fin structures, a segment connected with the fourth fin structure, and a segment connected with the fifth and sixth fin structures; and
providing the third set having a segment connected with the first fin structure, a segment connected with the second and third fin structures, and a segment connected with the fifth and sixth fin structures.

3. The method according to claim 2, comprising:
providing, on the substrate, a static random access memory (SRAM) bitcell having first and second pull-down (PD), pass-gate (PG), and pull-up (PU) transistors, the first set of segments being formed on the first PD, PG, and PU transistors and the third set of segments being formed on the second PD, PG, and PU transistors, wherein the first segment is on the first PG transistor.

4. The method according to claim 1, comprising:
providing third, fourth, fifth, and sixth fin structures intersecting with the at least one gate structure, the third fin structure separating the second and fourth fin structures, and the fifth fin structure separating the fourth and sixth fin structures;
providing the first set having the first segment connected with the second fin structure, a segment connected with the fourth fin structure and a segment connected with the fifth and sixth fin structures;
providing the second set having a segment connected with the third fin structure, a segment connected with the fourth fin structure, and a segment connected with the fifth and sixth fin structures; and
providing the third set having a segment connected with the first and second fin structures, a segment connected with the third fin structure, and a segment connected with the fifth fin structure.

5. The method according to claim 4, comprising:
providing, on the substrate, a SRAM bitcell having first and second PD, PG, and PU transistors, the first set of segments being formed on the first PD, PG, and PU transistors and the third set of segments being formed on the second PD, PG, and PU transistors, wherein the first segment is on the first PG transistor.

6. The method according to claim 1, comprising:
providing, on the substrate, a read-only memory (ROM) bitcell, the second fin structure and the first segment being formed on the ROM bitcell; and
providing the second segment of the trench salicide layer formed along the horizontal direction indicating a state of the ROM bitcell by being selectively connected or separated from the second fin structure, the first and second segments having different vertical positions on the substrate and separated from each other by a gate structure of the at least one gate structure.

7. The method according to claim 1, wherein the salicide layer is a trench salicide layer, the method further comprising:
providing the first and second fin structures with equal and unbroken spans in the vertical direction; and
providing a third fin structure on the substrate separated from the salicide layer.

8. The method according to claim 1, wherein the second fin structure is included in a netlist based on being connected with the salicide layer and the first fin structure is excluded from the netlist based on being separated from the salicide layer.

9. An apparatus comprising:
at least one gate structure on a substrate;
first and second fin structures in a vertical direction intersecting with the at least one gate structure;
first, second, and third sets of segments of a salicide layer, each of the first, second, and third sets having different vertical positions, separated from each other by a gate structure of the at least one gate structure, wherein the second set separates the first and third sets, and each of the sets of segments comprises segments having a length extending along a horizontal direction perpendicular to the vertical direction;
a first segment in the first set of segments of the salicide layer, the first segment being connected with the second fin structure and separated from the first fin structure; and
a second segment in the second set of segments of the salicide layer, the second segment selectively connecting with the first fin structure and separating from the second fin structure,
wherein positions of the segments of the salicide layer determine selection between a 1-1-2 type of static random access memory (SRAM) configuration and a 1-2-2 type of SRAM configuration.

10. The apparatus according to claim 9, comprising:
third, fourth, fifth, and sixth fin structures intersecting with the at least one gate structure, the second fin structure separating the first and third fin structures, the fourth fin structure separating the third and fifth fin structures, and the fifth fin structure separating the fourth and sixth fin structures;

the first set of segments having the first segment connected with the second and third fin structures, a segment connected with the fourth fin structure and a segment connected with the fifth and sixth fin structures;

the second set of segments having a segment connected with the first fin structure, a segment connected with the second and third fin structures, a segment connected with the fourth fin structure, and a segment connected with the fifth and sixth fin structures; and the third set of segments having a segment connected with the first fin structure, a segment connected with the second and third fin structures, and a segment connected with the fifth and sixth fin structures, wherein the first, second, and third sets of segments are formed along the horizontal direction, each of the first, second, and third sets having different vertical positions, separated from each other by a gate structure of the at least one gate structure, and the second set separates the first and third sets.

11. The apparatus according to claim 9, comprising:
third, fourth, fifth, and sixth fin structures intersecting with the at least one gate structure, the third fin structure separating the second and fourth fin structures, and the fifth fin structure separating the fourth and sixth fin structures;

the first set of segments having the first segment connected with the second fin structure, a segment connected with the fourth fin structure and a segment connected with the fifth and sixth fin structures;

the second set of segments having a segment connected with the third fin structure, a segment connected with the fourth fin structure, and a segment connected with the fifth and sixth fin structures; and the third set of segments having a segment connected with the first and second fin structures, a segment connected with the third fin structure, and a segment connected with the fifth fin structure, wherein the first, second, and third sets of segments are formed along the horizontal direction, each of the first, second, and third sets having different vertical positions, separated from each other by a gate structure of the at least one gate structure, and the second set separates the first and third sets.

12. The apparatus according to claim 11, comprising:
a SRAM bitcell having first and second PD, PG, and PU transistors, the first set of segments being formed on the first PD, PG, and PU transistors and the third set of segments being formed on the second PD, PG, and PU transistors, wherein the first segment is on the first PG transistor.

13. The apparatus according to claim 9, comprising:
a read-only memory (ROM) bitcell the second fin structure and the first segment being formed on the ROM bitcell; and the second segment of the trench salicide layer formed along the horizontal direction indicating a state of the ROM bitcell by being selectively connected or separated from the second fin structure, the first and second segments having different vertical positions on the substrate and separated from each other by a gate structure of the at least one gate structure.

14. The apparatus according to claim 9, wherein the salicide layer is a trench salicide layer and the first and second fin structures have equal and unbroken spans in the vertical direction, and wherein the apparatus further comprises a third fin structure on the substrate separated from the salicide layer.

15. A method comprising:
providing, on a substrate, a plurality of gate structures;
providing first, second, third, fourth, fifth, and sixth fin structures in a vertical direction intersecting with the gate structures, each having equal and unbroken spans in the vertical direction, the second fin structure separating the first and third fin structures, the fourth fin structure separating the third and fifth fin structures, the fifth fin structure separating the fourth and sixth fin structures;

providing a first static random access memory (SRAM) bitcell on the substrate having first and second pull-down (PD), pass-gate (PG), and pull-up (PU) transistors and a second SRAM bitcell on the substrate having third and fourth PD, PG, and PU transistors;

providing a first set of segments of the trench salicide layer, each segment in the first set having a length extending along a horizontal direction, the horizontal direction being perpendicular to the vertical direction, the first set having a segment on the first PD transistor connected with the first and second fin structures, a segment on the first PU transistor connected with the third fin structure, a segment on the first PG transistor connected with the fifth and sixth fin structures;

providing a second set of segments of the trench salicide layer, each segment in the second set having a length extending along a horizontal direction, the second set having a segment selectively connected with the first and second fin structures, a segment connected with the third fin structure, a segment connected with the fourth fin structure, and a segment connected with the fifth and sixth fin structures;

providing a third set of segments of the trench salicide layer, each segment in the third set having a length extending along a horizontal direction, the third set having a segment on the second PG transistor connected with the first and second fin structures, a segment on the second PU transistor connected with the fourth fin structure, a segment on the second PD transistor connected with the fifth and sixth fin structures;

providing a fourth set of segments of the trench salicide layer, each segment in the fourth set having a length extending along a horizontal direction, the fourth set having a segment on the third PD transistor connected with the first and second fin structures, a segment on the third PU transistor connected with the third fin structure, a segment on the first PG transistor connected with the fifth fin structure;

providing a fifth set of segments of the trench salicide layer, each segment in the fifth set having a length extending along a horizontal direction, the fifth set having a segment connected with the first and second fin structures, a segment connected with the third fin structure, a segment connected with the fourth fin structure, and a segment connected with the fifth and sixth fin structures; and providing a sixth set of segments of the trench salicide layer, each segment in the sixth set having a length extending along a horizontal direction, the sixth set having a segment on the fourth PG transistor connected with the second fin structure, a segment on the fourth PU transistor connected with the fourth fin structure, a segment on the fourth PD transistor connected with the fifth and sixth fin structures, wherein the second set separates the first and third sets, the third set separates the second and fourth sets, the fourth set separates the third and fifth sets, and the fifth set separates the fourth and sixth sets, and the first, second, third, fourth, fifth and sixth sets have different vertical positions on the substrate and are each separated from each other by a gate structure of the gate structures, wherein positions of the segments of the salicide layer determine selection between a 1-1-2 type of static random access memory (SRAM) configuration and a 1-2-2 type of SRAM configuration.

16. The method according to claim 15, comprising providing a seventh fin structure in the vertical direction intersecting with the gate structures on the substrate separated from the trench salicide layer.

17. The method according to claim 16, wherein the seventh fin structure is excluded from a netlist based on being separated from the trench salicide layer.

18. The method according to claim 15, comprising:
providing, on the substrate, a read-only memory (ROM) bitcell, the first fin structure being formed on the ROM bitcell;
providing, on the ROM bitcell, a first segment of the trench salicide layer formed along the horizontal direction and connected with the first fin structure; and
providing a second segment of the trench salicide layer formed along the horizontal direction indicating a state of the ROM bitcell by being selectively connected or separated from the first fin structure, the first and second segments having different vertical positions on the substrate and being separated from each other by a gate structure of the gate structures.

* * * * *